United States Patent
Iwami

(10) Patent No.: US 10,152,931 B2
(45) Date of Patent: Dec. 11, 2018

(54) DISPLAY DEVICE

(71) Applicant: Panasonic Liquid Crystal Display Co., Ltd., Himeji-shi, Hyogo (JP)

(72) Inventor: Takashi Iwami, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 70 days.

(21) Appl. No.: 15/471,753

(22) Filed: Mar. 28, 2017

(65) Prior Publication Data

US 2017/0278469 A1 Sep. 28, 2017

(30) Foreign Application Priority Data

Mar. 28, 2016 (JP) ................................. 2016-064539

(51) Int. Cl.
- G09G 3/36 (2006.01)
- G02F 1/1333 (2006.01)
- H01L 27/12 (2006.01)

(52) U.S. Cl.
CPC .......... *G09G 3/3611* (2013.01); *H01L 27/124* (2013.01); *H01L 27/1248* (2013.01); *G02F 1/1333* (2013.01); *G09G 2300/0426* (2013.01); *G09G 2310/0202* (2013.01); *G09G 2310/0243* (2013.01); *G09G 2330/02* (2013.01); *G09G 2330/045* (2013.01)

(58) Field of Classification Search
CPC . G09G 3/3911; H01L 27/124; H01L 27/1248; G02F 1/0121; G02F 1/1333; G02F 1/13452
See application file for complete search history.

(56) References Cited

U.S. PATENT DOCUMENTS

| | | | |
|---|---|---|---|
| 2002/0088984 A1* | 7/2002 | Toda | G02F 1/13452 257/99 |
| 2003/0127652 A1* | 7/2003 | Park | H01L 27/3244 257/72 |
| 2008/0001892 A1* | 1/2008 | Kim | G02F 1/1345 345/97 |

FOREIGN PATENT DOCUMENTS

JP 2009-020528 1/2009

* cited by examiner

*Primary Examiner* — Lisa Landis
(74) *Attorney, Agent, or Firm* — Hamre, Schumann, Mueller & Larson, P.C.

(57) ABSTRACT

A display device includes a display panel that displays an image, a drive circuit that outputs a drive signal to the display panel, a power supply line that is formed in the display panel to supply a power supply voltage to the drive circuit, and a ground line that is formed in the display panel to supply a ground potential to the drive circuit. At least parts of the power supply line and the ground line overlap each other in planar view with an insulator interposed therebetween.

9 Claims, 13 Drawing Sheets

FIG.3
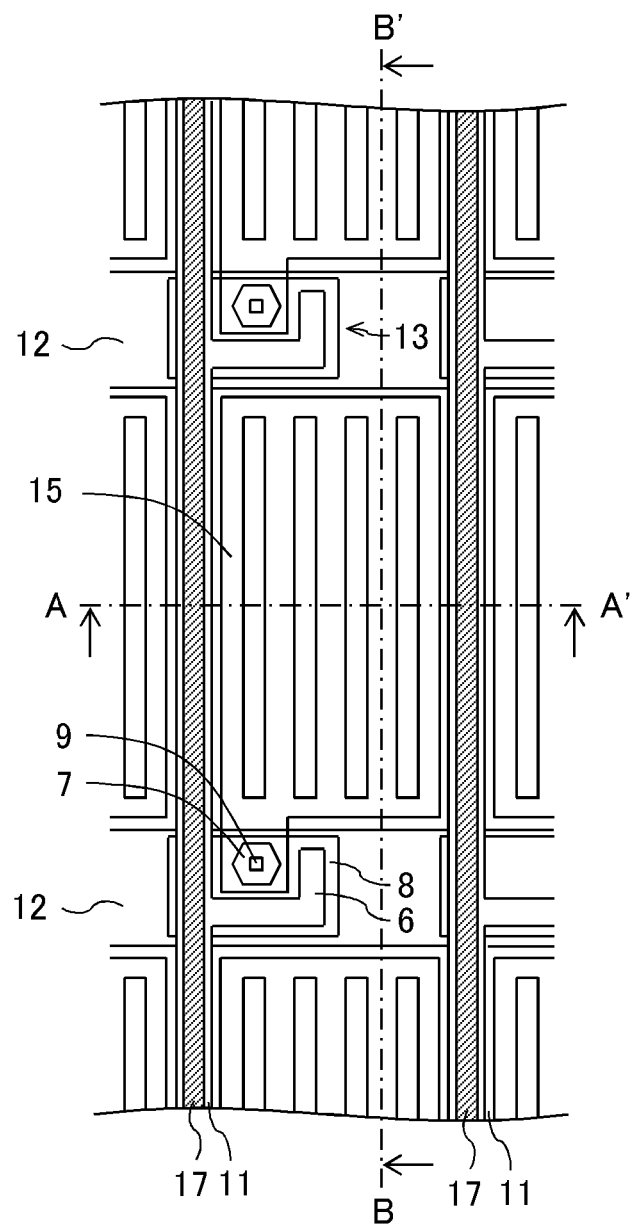
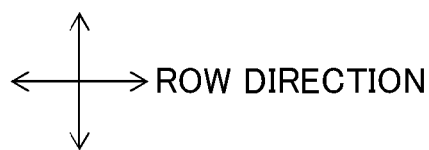

DISPLAY SURFACE SIDE
←↕→ ROW DIRECTION
REAR SURFACE SIDE

DISPLAY SURFACE SIDE
←↕→ COLUMN DIRECTION
REAR SURFACE SIDE

DISPLAY SURFACE SIDE
↕ COLUMN DIRECTION
REAR SURFACE SIDE

DISPLAY SURFACE SIDE
↕ COLUMN DIRECTION
REAR SURFACE SIDE

DISPLAY DEVICE

CROSS-REFERENCE TO RELATED APPLICATION

The present application claims priority from Japanese application JP 2016-064539 filed on Mar. 28, 2016, the content of which is hereby incorporated by reference into this application.

TECHNICAL FIELD

This disclosure relates to a display device.

BACKGROUND

Nowadays, in the display device, with increasing resolution of a display panel, a transmission rate of a video signal is enhanced, and a number of source drivers tends to increase. Therefore, a number of driving pulses per source driver increases, and heat generation of the source driver increases. A wiring disposed in the display panel is lengthened, and particularly, a radiation noise from a power supply line increases.

Conventionally, as a technique dealing with the high resolution of the display panel, for example, Patent Literature 1: JP 2009-20528 A discloses a technique of reducing a high-frequency clock noise and the like caused by an increase in a number of image signal lines (data lines).

Recently, with the high resolution of the display panel, there is proposed a narrowed frame of the display panel. In the display panel having the narrowed frame, because a wiring region is narrowed and a wiring pattern is elongated, a wiring resistance increases and the radiation noise further increases. Even if the conventional technique is applied to such a display device, it is difficult to sufficiently reduce the heat generation of the source driver and the radiation noise from the power supply line.

SUMMARY

The present disclosure has been made in view of the above circumstances, and an object thereof is to provide a display device that can reduce an influence of a radiation noise from a power supply line while suppressing heat generation of a source driver without enlarging a frame region.

In one general aspect, the instant application describes a display device including a display panel that displays an image, a drive circuit that outputs a drive signal to the display panel, a power supply line that is formed in the display panel to supply a power supply voltage to the drive circuit, and a ground line that is formed in the display panel to supply a ground potential to the drive circuit. At least parts of the power supply line and the ground line overlap each other in planar view with an insulator interposed therebetween.

The above general aspect may include one or more of the following features.

The ground line may include first and second ground lines through which the ground potential is supplied to the drive circuit, and the power supply line, the first ground line, and the second ground line may be formed in different layers, respectively, and at least parts of the power supply line, the first ground line, and the second ground line may overlap one another in planar view with an insulator interposed therebetween.

The first ground line, the power supply line, and the second ground line may be laminated in this order with the insulator interposed therebetween.

The display device may further include a plurality of signal lines through which a data signal and a control signal are supplied to the display panel to generate the drive signal. The ground line may further include third and fourth ground lines through which the ground potential is supplied to the drive circuit, and the third ground line and the fourth ground line may be formed at both ends in a layer, which is located between the first ground line and the second ground line and may be identical to a layer in which the plurality of signal lines are formed, such that at least parts of the plurality of signal lines may be sandwiched between the third ground line and the fourth ground line, and the third ground line and the fourth ground line may be electrically connected to the first ground line and the second ground line.

The power supply line may include first and second supply lines through which the power supply voltage is supplied to the drive circuit. The ground line, the first power supply line, and the second power supply line may be formed in different layers, respectively, and at least parts of the ground line, the first power supply line, and the second power supply line may overlap one another in planar view with an insulator interposed therebetween.

The first power supply line, the ground line, and the second power supply line may be laminated in this order with the insulator interposed therebetween.

The display device may further include a signal line through which a data signal and a control signal are supplied to the display panel to generate the drive signal. A part of the ground line may overlap the signal line in planar view with an insulator interposed therebetween.

A plurality of the drive circuits may be mounted on the display panel. The display device may further include a control circuit substrate connected to the display panel and on which a control circuit is mounted, the control circuit outputting a data signal and a control signal, the power supply voltage, and the ground potential, the data signal and a control signal being used to generate the drive signal. Each of the plurality of the drive circuits may include a first drive circuit closer to an input terminal to which each of the signals output from the control circuit substrate is input in the display panel and a second drive circuit farther from the input terminal than the first drive circuit. An area of an overlapping portion in which the power supply line and the ground line connected to the second drive circuit overlap each other may be larger than an area of an overlapping portion in which the power supply line and the ground line connected to the first drive circuit overlap each other.

The display panel may include a plurality of gate lines, a plurality of data lines, a common electrode, a common wiring through which a common voltage is supplied to the common electrode, and a plurality of pixel electrodes. One of the power supply line and the ground line may be formed in a layer identical to a layer in which the plurality of gate lines are formed, and another of the power supply line and the ground line is formed in a layer identical to a layer in which the plurality of data lines are formed, or one of the power supply line and the ground line is formed in a layer identical to a layer in which the plurality of data lines are formed and another of the power supply line and the ground line is formed in a layer identical to a layer in which the common electrode is formed.

According to the configuration of the display device of the present disclosure, the influence of the radiation noise from the power supply line can be reduced while the heat generation of the source driver is suppressed without enlarging the frame region.

BRIEF DESCRIPTION OF THE DRAWINGS

FIG. 3 is a plan view partially illustrating a configuration of display panel.

DETAILED DESCRIPTION

In the following exemplary embodiment, a liquid crystal display device is described below by way of example. However, a display device according to the present disclosure is not limited to the liquid crystal display device, but may be an organic EL display device and the like.

Figure 1:
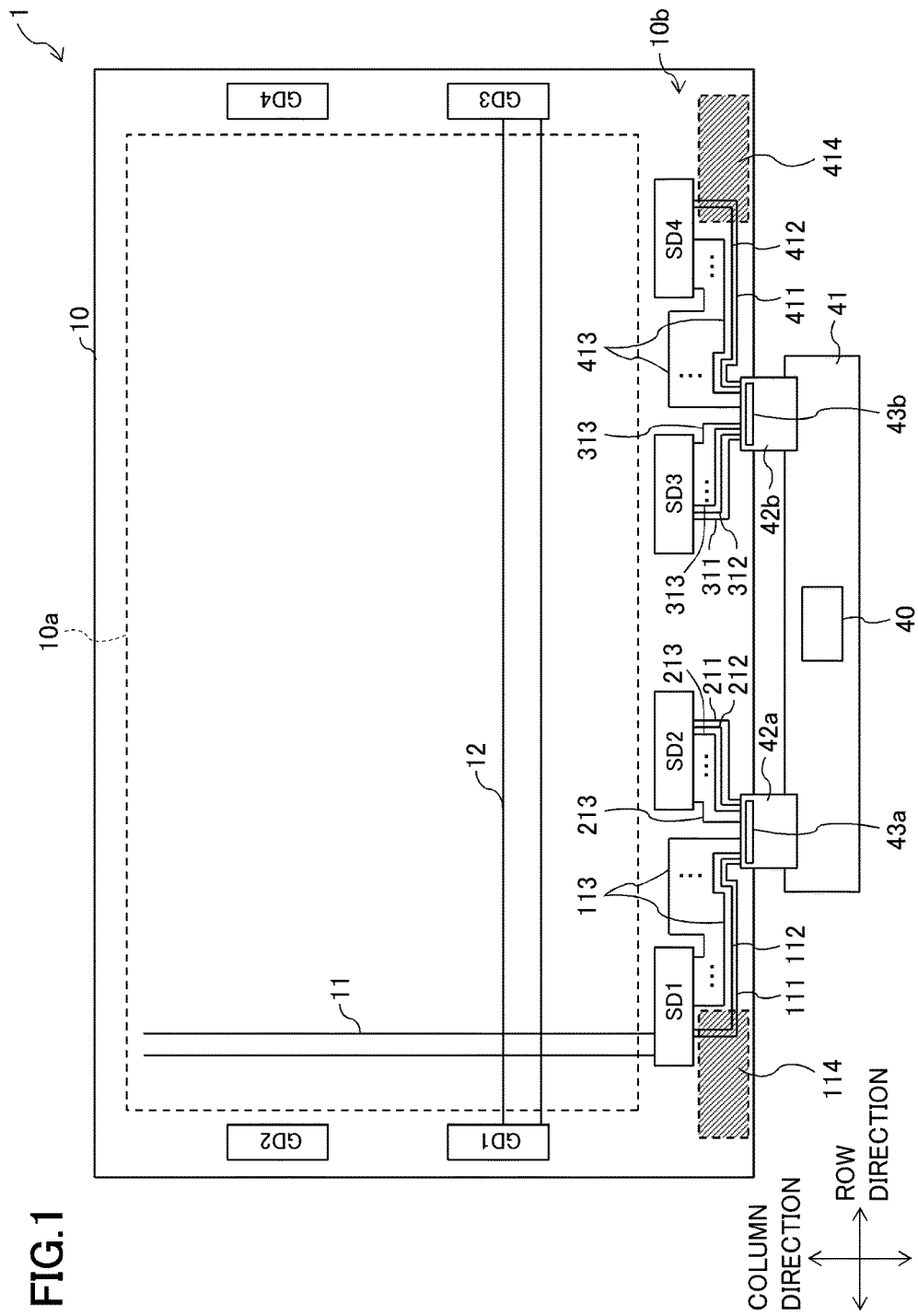
FIG. 1 is a plan view illustrating a schematic configuration of a liquid crystal display device according to an exemplary embodiment.

FIG. 1 is a plan view illustrating a schematic configuration of a liquid crystal display device according to an exemplary embodiment. Liquid crystal display device 1 includes display panel 10 that displays an image, driving circuits (source driver SD, gate driver GD, and a common driver (not illustrated)) that drive display panel 10, control circuit 40 that controls each driving circuit, control circuit substrate 41 on which control circuit 40 is mounted, and a backlight (not illustrated) that irradiates display panel 10 with light from a rear surface side. When display panel 10 is divided into regions, display panel 10 includes display region 10a that displays the image and non-display region 10b (also referred to as a frame region) around display region 10a. Source driver SD and gate driver GD are provided in non-display region 10b. Although four source drivers SD1 to SD4 and four gate drivers GD1 to GD4 are illustrated in FIG. 1, there is no limitation to the numbers of source drivers SD and gate drivers GD. Hereinafter, the driving circuit is referred to as source driver SD for the description common to source drivers SD1 to SD4, and the driving circuit is referred to as gate driver GD for the description common to gate drivers GD1 to GD4.

Each source driver SD outputs a data signal (data voltage) to a plurality of corresponding data lines 11. Each gate driver GD outputs a gate signal (gate voltage) to a plurality of corresponding gate lines 12. The common driver outputs common voltage Vcom to common line 17 (see FIG. 3).

Display panel 10 and control circuit substrate 41 are electrically connected to each other through a flexible printed circuit (FPC). FIG. 1 illustrates two FPCs 42a, 42b. The number of FPCs is set according to the number of source drivers SD, a size of display panel 10, and a size of control circuit substrate 41. However, control circuit substrate 41 is set to a necessary minimum size because cost increases with increasing substrate area, and the number and arrangement of FPCs are set according to the size. Therefore, in the example of FIG. 1, the data signal and control signal for source drivers SD1, SD2, which are output from control circuit 40, are input to input terminal 43a through FPC 42a, and input to source drivers SD1, SD2 through wirings connected to input terminal 43a. The data signal and control signal for source drivers SD3, SD4, which are output from control circuit 40, are input to input terminal 43b through FPC 42b, and input to source drivers SD3, SD4 through wirings connected to input terminal 43b. At this point, the wiring, which connects input terminal 42a and source driver SD1, includes ground line 111 through which a ground potential is transmitted, power supply line 112 through which a power supply voltage is transmitted, and signal line 113 through which the data signal and the control signal are transmitted. The wiring, which connects input terminal 42a and source driver SD2, includes ground line 211 through which the ground potential is transmitted, power supply line 212 through which the power supply voltage is transmitted, and signal line 213 through which the data signal and the control signal are transmitted. The same applies for the wirings which connect input terminal 42b and source drivers SD3, SD4. For example, the ground potential is a power supply potential on a low potential side, and the power supply voltage is a power supply potential on a high potential side. These potentials are output from a power supply circuit (not illustrated) mounted on control circuit substrate 41.

Due to an arrangement relationship among each source driver SD, FPCs 42a, 42b, and control circuit substrate 41, a distance from input terminal 42a to source driver SD1 is longer than a distance from input terminal 42a to source driver SD2. Therefore, ground line 111, power supply line 112, and signal line 113 are longer than ground line 211, power supply line 212, and signal line 213, respectively. Similarly, ground line 411, power supply line 412, and signal line 413 are longer than ground line 311, power supply line 312, and signal line 313, respectively. Although gate driver GD is omitted, gate driver GD has a configuration similar to that of source driver SD. For example, because the distance from input terminal 42a to gate driver GD2 is longer than the distance from input terminal 42a to gate driver GD1, each wiring connecting input terminal 42a and gate driver GD2 is longer than each wiring connecting input terminal 42a and gate driver GD1. Similarly, each wiring connecting input terminal 42b and gate driver GD4 is longer than each wiring connecting input terminal 42b and gate driver GD3.

Figure 2:
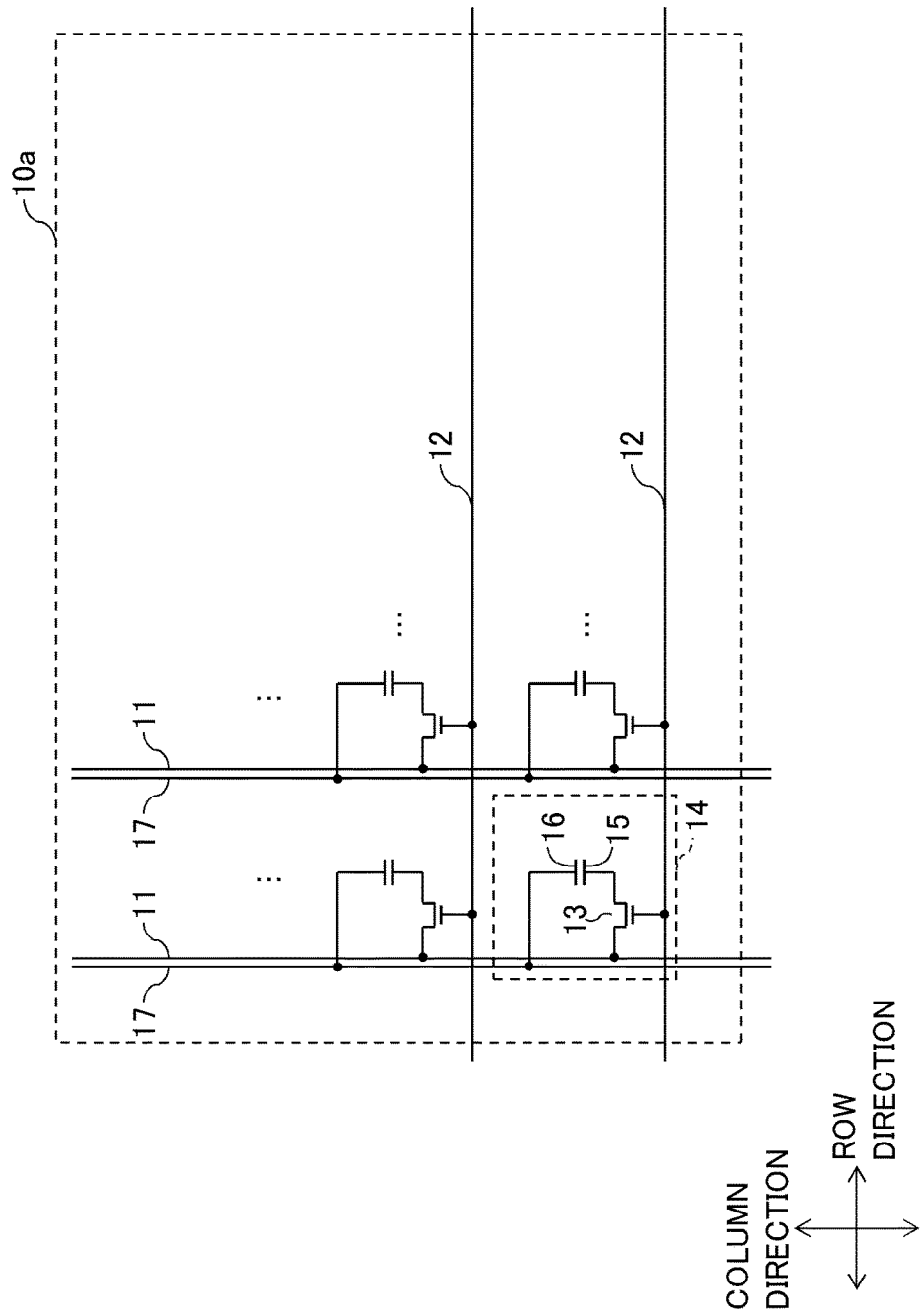
FIG. 2 is a plan view illustrating a schematic configuration of display region in display panel.
Figure 4:
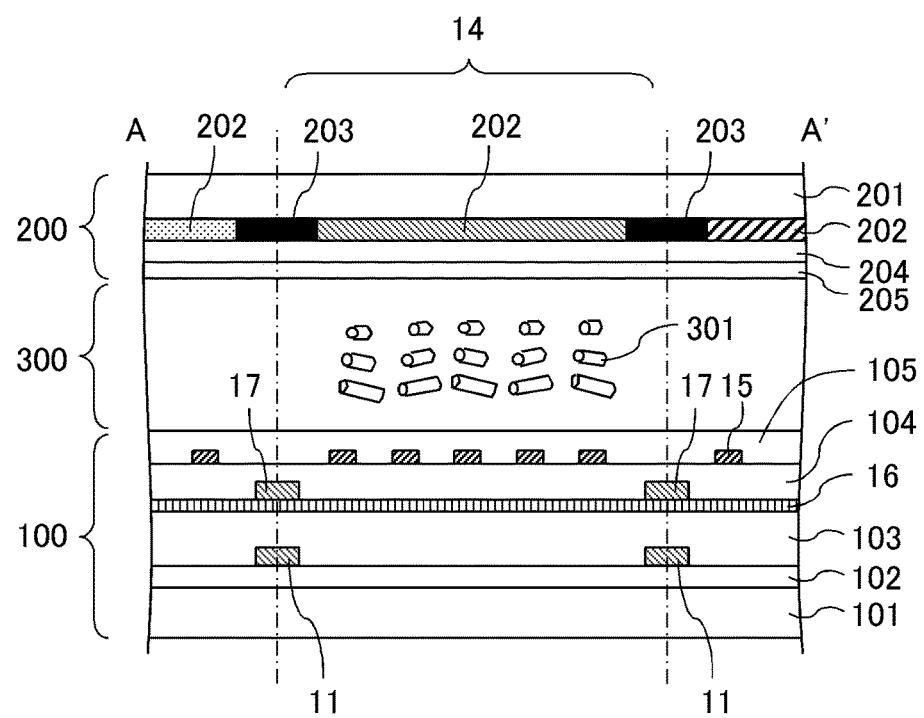
FIG. 4 is a sectional view taken along line A-A' in FIG. 3.
Figure 5:
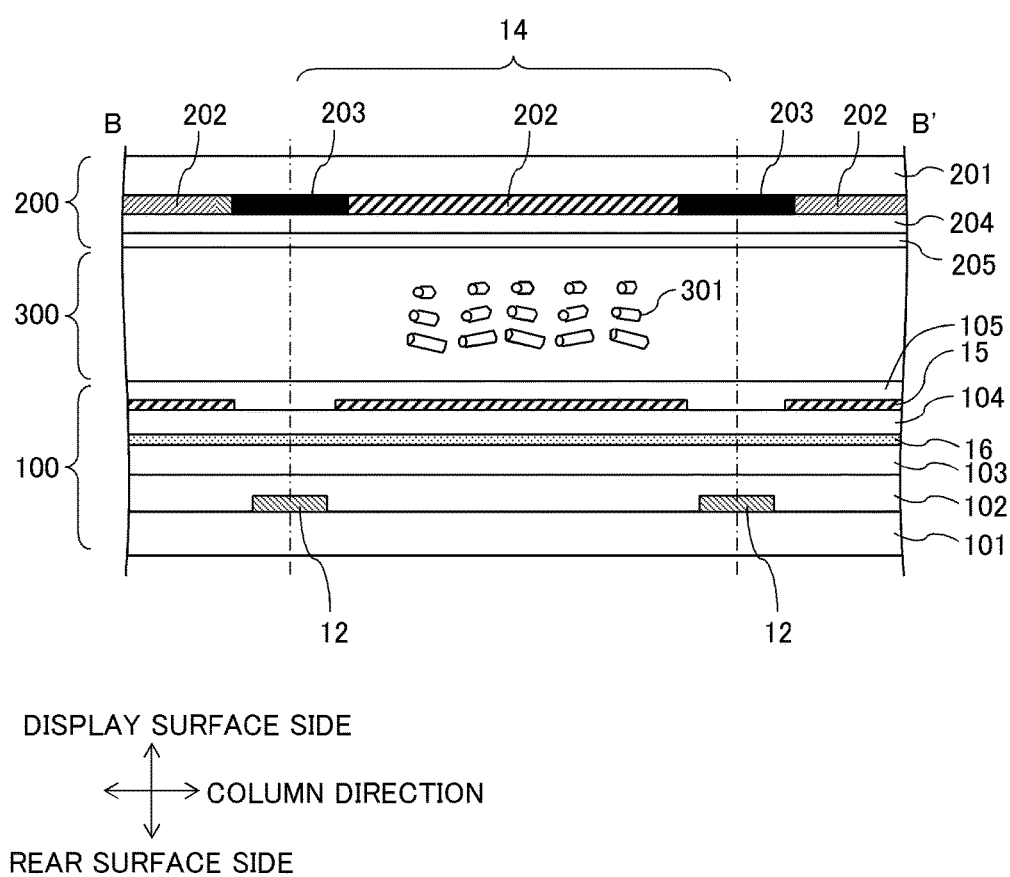
FIG. 5 is a sectional view taken along line B-B' in FIG. 3.

FIG. 2 is a plan view illustrating a schematic configuration of display region 10a in display panel 10. FIG. 3 is a plan view partially illustrating a configuration of display panel 10. FIG. 4 is a sectional view taken along line A-A' in FIG. 3, and FIG. 5 is a sectional view taken along line B-B' in FIG. 3. As illustrated in FIG. 4, display panel 10 includes thin film transistor substrate (hereinafter, referred to as a TFT substrate) 100 disposed on the rear surface side, color filter substrate (hereinafter, referred to as a CF substrate) 200 that is disposed on the front surface side (display surface side) to face TFT substrate 100, and liquid crystal layer 300 sandwiched between TFT substrate 100 and CF substrate 200. For convenience, FIG. 3 illustrates the state of TFT substrate 100 that is seen from the front surface side through CF substrate 200.

TFT substrate 100 is provided with a plurality of data lines 11 extending in a first direction (for example, a column direction), a plurality of common lines 17 extending in the first direction (for example, the column direction) so as to overlap data lines 11 in planar view, and a plurality of gate lines 12 extending in a second direction (for example, a row direction) different from the first direction. TFT 13 is formed in a neighborhood of each of intersections of the plurality of data lines 11 and the plurality of gate lines 12, a rectangular region surrounded by two adjacent data lines 11 and two adjacent gate lines 12 is defined as one pixel 14, and a plurality of pixels 14 are arranged in a matrix form (in the row direction and the column direction). The plurality of data lines 11 and the plurality of common lines 17 are arranged at equal intervals in the row direction, and the plurality of gate lines 12 are arranged at equal intervals in the column direction. In FIG. 2, for convenience, common line 17 is illustrated adjacent to data line 11.

Pixel electrode 15 is provided in each pixel 14. As illustrated in FIG. 3, each pixel electrode 15 includes an opening (for example, a slit), and is formed into a stripe shape. One common electrode 16 (see FIGS. 4 and 5) shared by pixels 14 is formed in TFT substrate 100. In TFT 13, semiconductor layer 8 made of amorphous silicon (a-Si) is formed on gate insulator 102 (see FIGS. 4 and 5), and drain electrode 6 and source electrode 7 are formed on semiconductor layer 8. Drain electrode 6 is electrically connected to data line 11, and source electrode 7 and pixel electrode 15 are electrically connected to each other through contact hole 9.

The data signal (data voltage) is supplied from corresponding source driver SD to each data line 11, and the gate signal (gate voltage) is supplied from corresponding gate driver GD to each gate line 12. Common voltage Vcom is supplied from a common driver to common electrode 16 through common line 17. When an on voltage (gate-on voltage) of the gate signal is supplied to gate line 12, TFT 13 connected to gate line 12 is turned on to supply the data voltage to pixel electrode 15 through data line 11 connected to TFT 13. An electric field is generated by a difference between the data voltage supplied to the pixel electrode 15 and the common voltage Vcom supplied to the common electrode 16. The liquid crystal is driven by the electric field to control transmittance of the light transmitted from the backlight, thereby displaying the image. The desired data voltages are supplied to data lines 11 connected to pixel electrodes 15 of pixels 14, which are formed by striped colored portions to correspond to red, green, and blue, thereby performing color display.

A sectional structure of pixel 14 will specifically be described below with reference to FIGS. 4 and 5. FIG. 4 illustrates a cross-section (A-A' section) in which an opening region of pixel 14 in FIG. 3 is cut in the row direction, and FIG. 5 illustrates a cross-section (B-B' section) in which the opening region of pixel 14 in FIG. 3 is cut in the column direction.

In TFT substrate 100, gate line 12 is formed on glass substrate 101. Gate insulator 102 is formed so as to cover gate line 12. Semiconductor layer 8 (see FIG. 2) is formed on gate insulator 102. Data line 11 and drain electrode 6 and source electrode 7, which constitute TFT 13 (see FIG. 2), are formed on semiconductor layer 8. Drain electrode 6 is electrically connected to data line 11. Insulator 103 is formed so as to cover data line 11, drain electrode 6, and source electrode 7. Insulator 103 may include an organic insulator. That is, insulator 103 may be configured by two layers including an inorganic insulator and an organic insulator. Common electrode 16 is formed on insulator 103. Common electrode 16 is made of a transparent electrode material ITO. A region of each pixel 14 is covered with common electrode 16 except for a region where TFT 13 is formed. That is, common electrode 16 covers data line 11 to serve as a shield electrode. Common line 17 is formed on common electrode 16 so as to overlap data line 11 in planar view.

Upper insulator 104 is formed so as to cover common electrode 16 and common electrode line 17. Pixel electrode 15 is formed on upper insulator 104. Pixel electrode 15 is made of a transparent electrode material ITO. Pixel electrode 15 is electrically connected to source electrode 7 through contact hole 9 (see FIG. 3) formed in insulator 103 and upper insulator 104. Alignment film 105 is formed so as to cover pixel electrode 15. In the configuration of FIGS. 4 and 5, common electrode 16 is disposed in a lower layer while pixel electrode 15 is disposed in an upper layer. Alternatively, pixel electrode 15 may be disposed in the lower layer while common electrode 16 is disposed in the upper layer.

In CF substrate 200, colored portion 202 and black matrix 203 are formed on glass substrate 201. For example, colored portion 202 is formed by a colored layer of red, green, and blue pigment-dispersion resists, and black matrix 203 is made of a resin material in which black pigment is used or a metallic material. Overcoat film 204 is formed so as to cover colored portion 202 and black matrix 203, and alignment film 205 is formed on overcoat film 204.

Liquid crystal layer 300 includes liquid crystal molecules 301 having a positive or negative dielectric anisotropy.

Although the pixel structure having the IPS scheme is cited as an example, the present disclosure is not limited thereto. The layered structure of each portion constituting pixel 14 is not limited to the above configuration.

Figure 6:
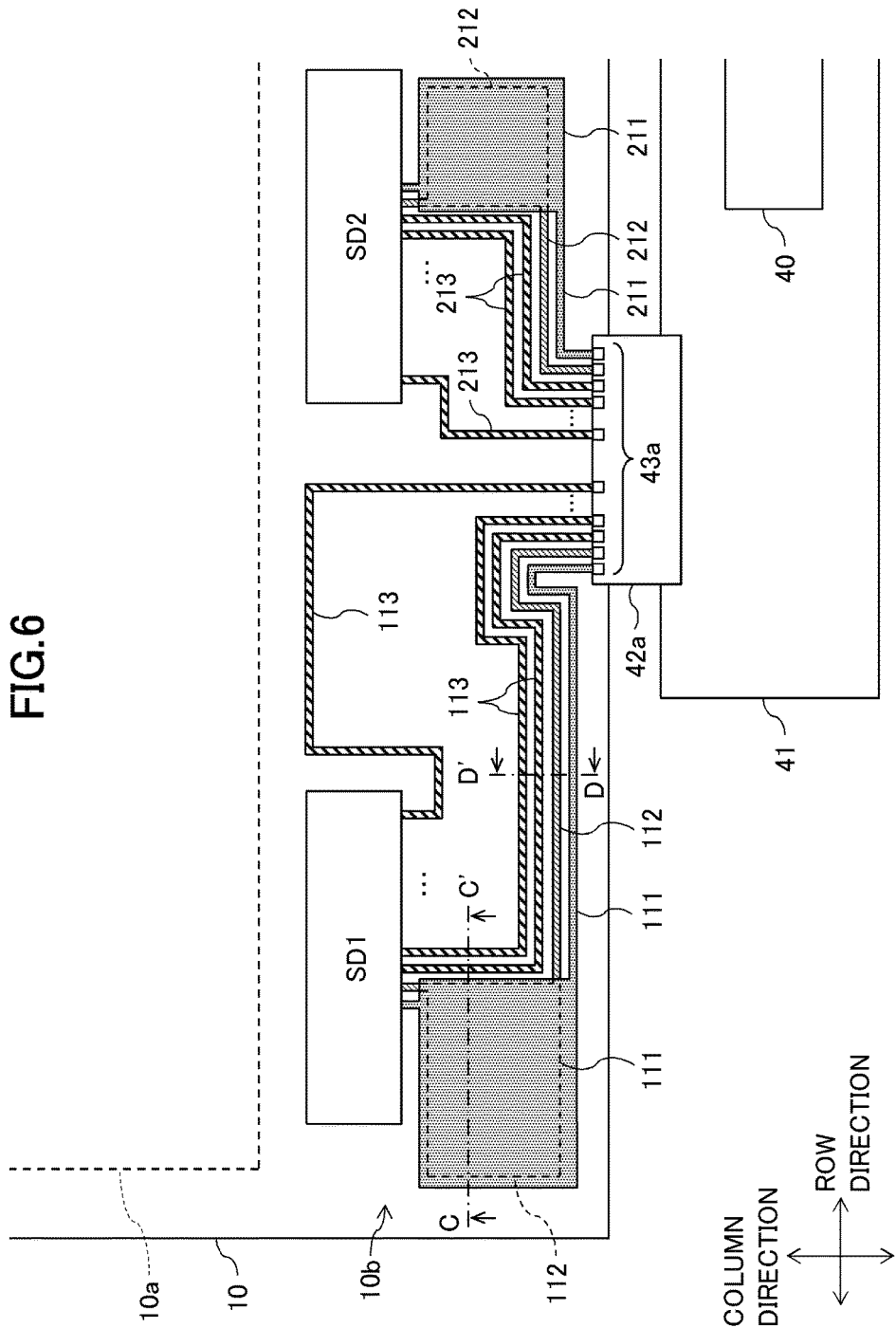
FIG. 6 is a plan view partially illustrating a configuration of non-display region.
Figure 7:
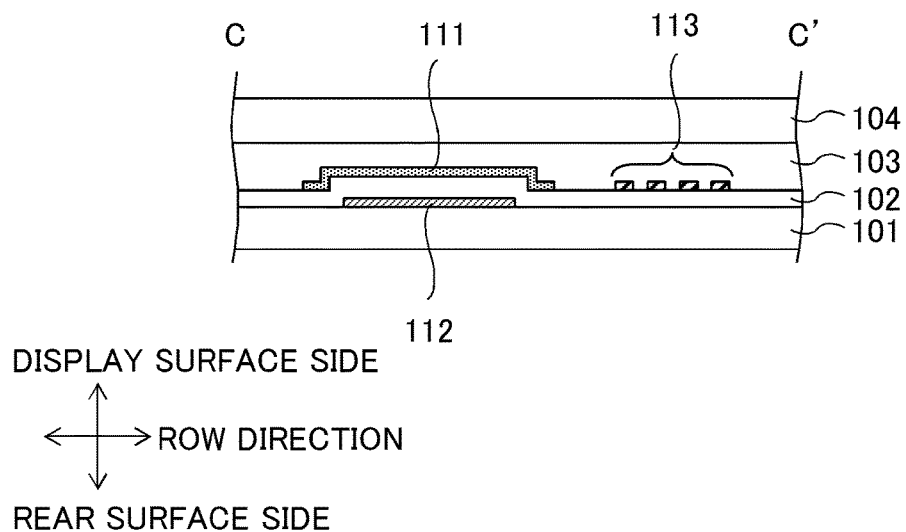
FIG. 7 is a sectional view taken along line C-C' in FIG. 6.
Figure 8:
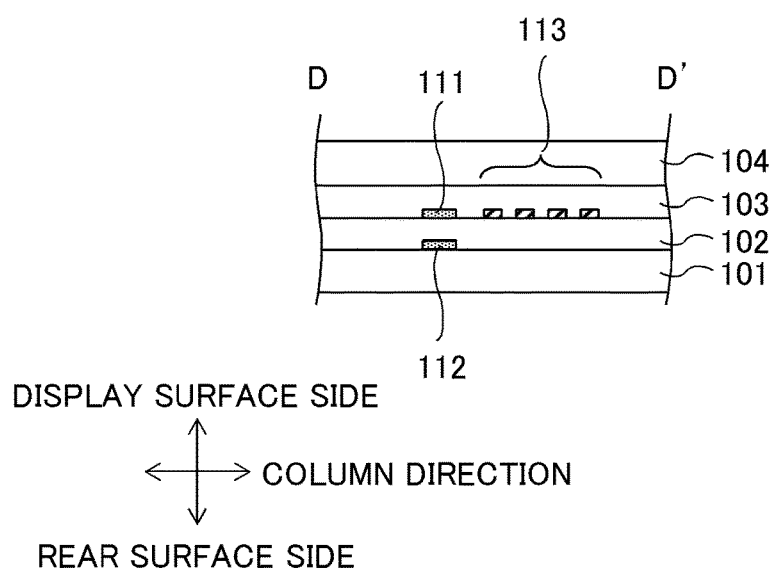
FIG. 8 is a sectional view taken along line D-D' in FIG. 6.

A configuration of each wiring disposed in non-display region 10b will be described below. FIG. 6 is a plan view partially illustrating a configuration of non-display region 10b. FIG. 7 is a sectional view taken along line C-C' in FIG. 6, and FIG. 8 is a sectional view taken along line D-D' in FIG. 6. The configuration of source driver SD will mainly be described below by way of example.

As illustrated in FIG. 6, a wiring, through which each signal output from control circuit 40 and input to input terminal 43a through FPC 42a is transmitted to source driver SD1, is disposed in non-display region 10b. For example, ground line 111 through which the ground potential is transmitted, power supply line 112 through which the power supply voltage is transmitted, and signal line 113 through which the data signal and the control signal are transmitted are disposed in non-display region 10b. Similarly, a wiring, through which each signal output from control circuit 40 and input to input terminal 43a through FPC 42a is transmitted to source driver SD2, is disposed in non-display region 10b. For example, ground line 211 through which the ground potential is transmitted, power supply line 212 through which the power supply voltage is transmitted, and signal line 213 through which the data signal and the control signal are transmitted are disposed in non-display region 10b.

As illustrated in FIG. 6, signal lines 113 are disposed from input terminal 43a to source driver SD1 so as to be parallel to each other. Ground line 111 and power supply line 112 are disposed such that at least parts of ground line 111 and power supply line 112 overlap each other in planar view (see FIG. 6). In the example of FIG. 6, ground line 111 and power supply line 112 are disposed so as to be parallel to each other in a region near input terminal 43a and a region extending in the row direction, and in a region near source driver SD1, ground line 111 and power supply line 112 are disposed so as to overlap each other in an empty space (region 114 in FIG. 1) in which signal line 113 is not disposed (a lower left region in FIG. 6). In a portion (hereinafter, referred to as an overlapping portion) in which ground line 111 and power supply line 112 overlap each other, areas of ground line 111 and power supply line 112 are largely formed so as to fill region 114. In a portion in which the areas of ground line 111 and power supply line 112 are enlarged, ground line 111 is preferably larger than power supply line 112 in a planar view.

As illustrated in FIGS. 7 and 8, in TFT substrate 100, power supply line 112 is formed on glass substrate 101, and gate insulator 102 is formed so as to cover power supply line 112. Ground line 111 and signal line 113 are formed on gate insulator 102. Insulator 103 is formed so as to cover ground line 111 and signal line 113, and upper insulator 104 is formed on insulator 103. For example, gate line 12 and power supply line 112 have a two-layer structure of copper (Cu) and molybdenum (Mo). Power supply line 112 is formed in the same layer as gate line 12 (see FIG. 5), so that gate line 12 and power supply line 112 can be formed through the same process with a mask used to form gate line 12. Gate line 12 and power supply line 112 can simultaneously be formed through the same process. Ground line 111 and signal line 113 are formed in the same layer as data line 11 (see FIG. 4), so that data line 11, ground line 111, and signal line 113 can be formed through the same process with a mask used to form data line 11.

In the above configuration, the overlapping portion in which the areas of ground line 111 and power supply line 112 are enlarged forms a heat dissipation route for source driver SD1, so that a heat dissipation effect of source driver SD1 can be enhanced. Therefore, the heat generation of source driver SD1 can be suppressed. In the overlapping portion, ground line 111 and power supply line 112 face each other with gate insulator 102 interposed therebetween, so that the overlapping portion serves as a capacitor (bypass capacitor) while ground line 111 and power supply line 112 are used as electrodes. Therefore, power supply capacity can be increased near source driver SD1. Accordingly, the influence of the radiation noise from power supply line 112 can be reduced. Additionally, the frame region does not increase because ground line 111 and power supply line 112 can extend in the empty space of non-display region 10b while overlapping each other.

Figure 9:
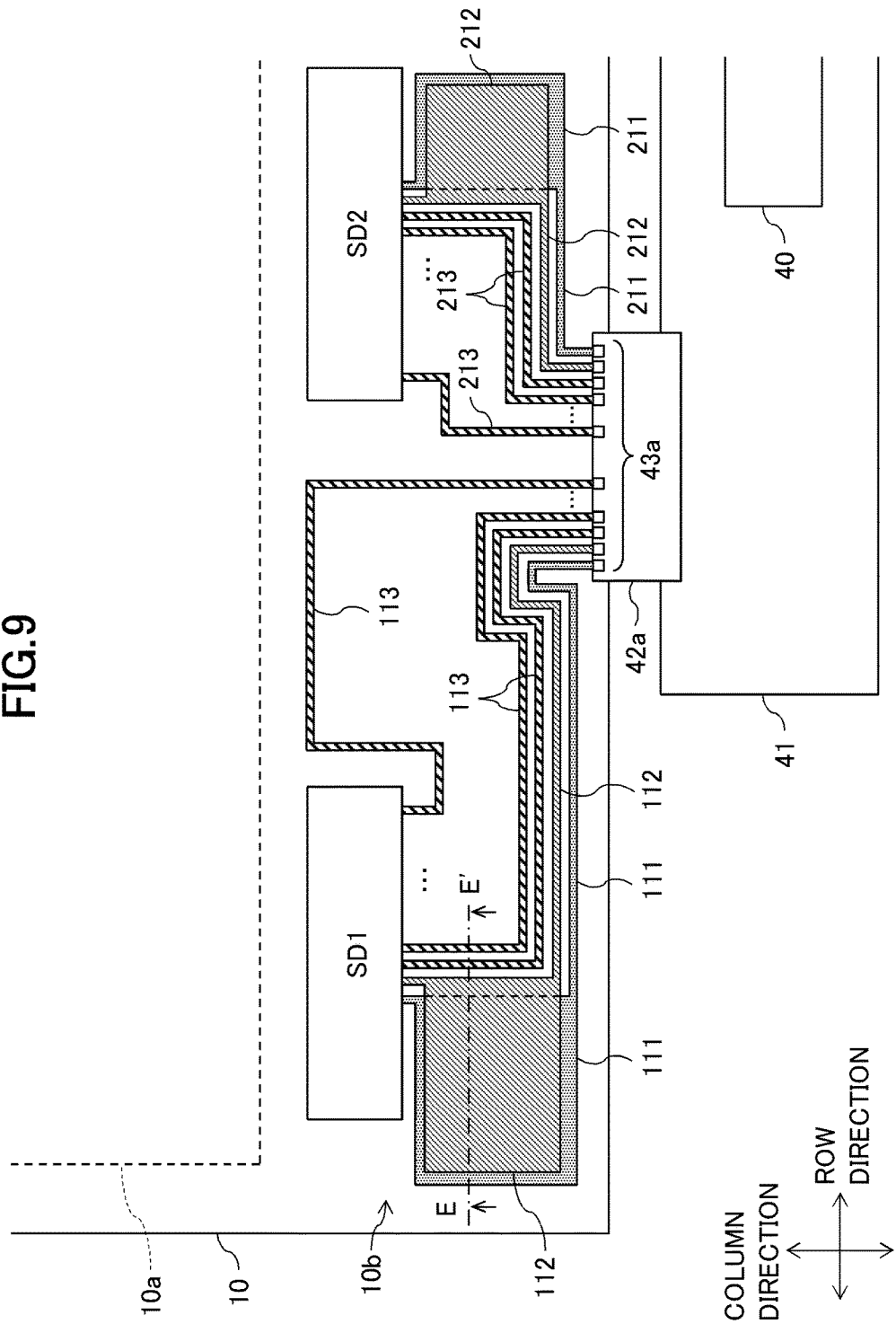
FIG. 9 is a plan view illustrating another arrangement configuration of ground line and power supply line.
Figure 10:
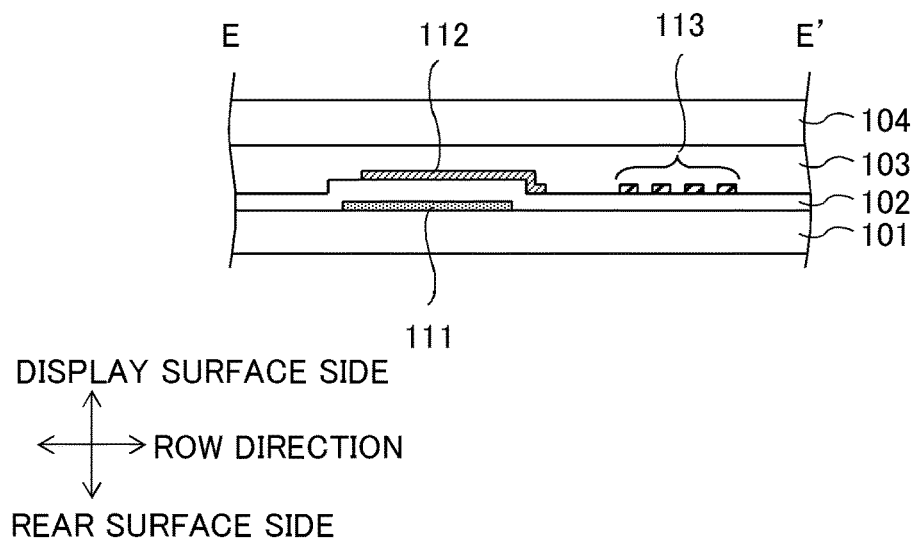
FIG. 10 is a sectional view taken along line E-E' in FIG. 9.

Ground line 111 and power supply line 112 are not limited to the above arrangement configuration. FIG. 9 is a plan view illustrating another arrangement configuration of ground line 111 and power supply line 112. FIG. 10 is a sectional view taken along line E-E' in FIG. 9. As illustrated in FIGS. 9 and 10, power supply line 112 may be formed in the upper layer of ground line 111. Specifically, in TFT substrate 100, ground line 111 is formed on glass substrate 101, and gate insulator 102 is formed so as to cover ground line 111. Power supply line 112 and signal line 113 are formed on gate insulator 102. Insulator 103 is formed so as to cover power supply line 112 and signal line 113, and upper insulator 104 is formed on insulator 103.

Figure 11:
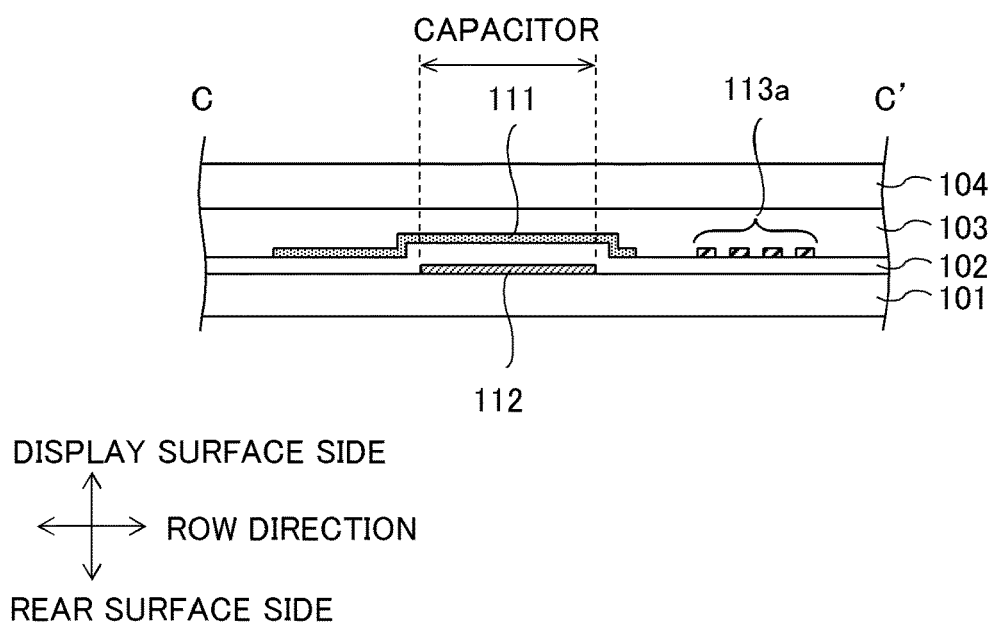
FIG. 11 is a sectional view illustrating still another arrangement configuration of ground line and power supply line.

FIG. 11 is a sectional view illustrating still another arrangement configuration of ground line 111 and power supply line 112. In the configuration of FIG. 11, ground line 111 in FIGS. 6 and 7 is formed such that the area of ground line 111 is further enlarged. Specifically, ground line 111 extends further beyond power supply line 112 in the column direction. In the configuration of FIG. 11, the overlapping portion of ground line 111 and power supply line 112 serves as the bypass capacitor, so that the influence of the radiation noise from power supply line 112 can be reduced similarly to the above effect. Since ground line 111 is extended, the heat dissipation effect can be enhanced as compared with the configuration in FIGS. 6 and 7.

One of ground line 111 and power supply line 112 may be formed on gate insulator 102 while the other is formed on insulator 103.

Figure 12:
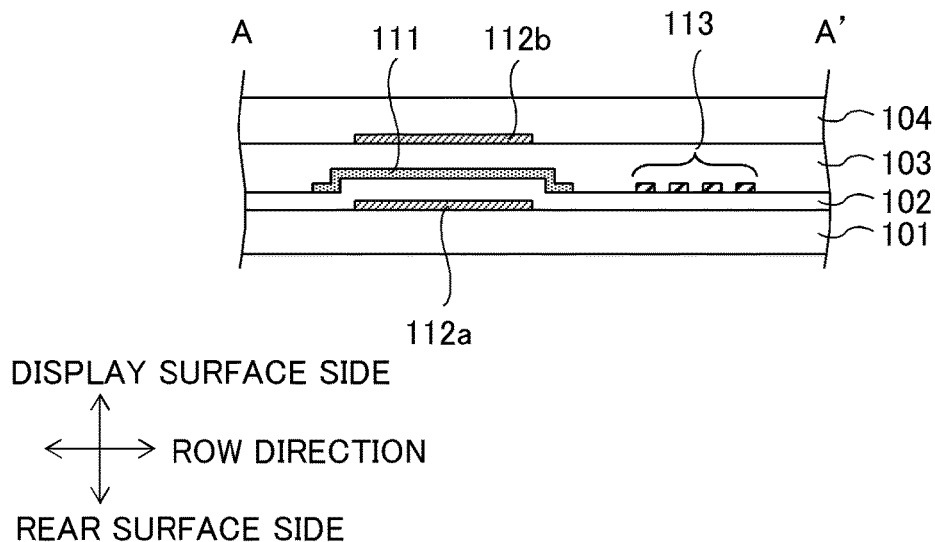
FIG. 12 is a sectional view illustrating yet another arrangement configuration of ground line and power supply line.

FIG. 12 is a sectional view illustrating yet another arrangement configuration of ground line 111 and power supply line 112. Referring to FIG. 12, second power supply line 112b is further formed in the upper layer of ground line 111 in the configuration of FIGS. 6 and 7. Specifically, in TFT substrate 100, first power supply line 112a is formed on glass substrate 101, and gate insulator 102 is formed so as to cover first power supply line 112a. Ground line 111 and signal line 113 are formed on gate insulator 102. Insulator 103 is formed so as to cover ground line 111 and signal line 113. Second power supply line 112b is formed on insulator 103, and upper insulator 104 is formed so as to cover second power supply line 112b. Second power supply line 112b is formed so as to overlap ground line 111 in planar view.

In the configuration of FIG. 12, a first bypass capacitor is formed by first power supply line 112a and ground line 111, and a second by pass capacitor is formed by second power supply line 112b and ground line 111, so that the power supply capacity can further be increased. Therefore, the influence of the radiation noise from power supply line 112 can further be reduced. The area of power supply line 112 is increased by the area of second power supply line 112b, so that the heat dissipation effect can further be enhanced compared with the configuration in FIGS. 6 and 7. Second power supply line 112b is formed in the same layer as common wiring 17 (see FIG. 4), so that common wiring 17 and second power supply line 112b can be formed through the same process with a mask used to form common wiring 17. For example, common wiring 17 and second power supply line 112b have a single-layer structure of copper (Cu).

Figure 13:
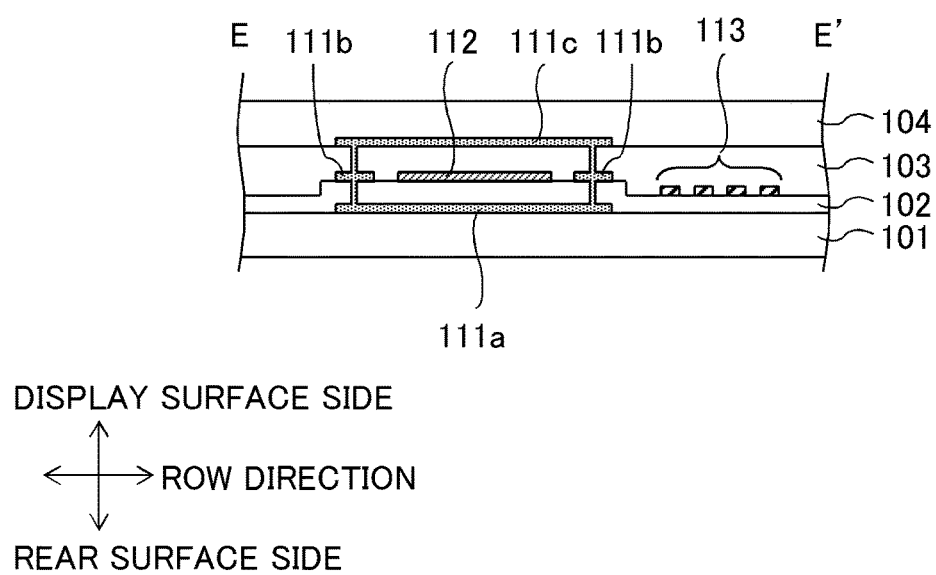
FIG. 13 is a sectional view illustrating yet another arrangement configuration of ground line and power supply line.

FIG. 13 is a sectional view illustrating yet another arrangement configuration of ground line 111 and power supply line 112. Referring to FIG. 13, a ground line is further formed in the upper layer of power supply line 112 in the configuration of FIG. 10. Specifically, in TFT substrate 100, first ground line 111a is formed on glass substrate 101. Gate insulator 102 is formed so as to cover first ground line 111a. Second ground line 111b, power supply line 112, and signal line 113 are formed on gate insulator 102. Insulator 103 is formed so as to cover second ground line 111b, power supply line 112, and signal line 113. Third ground line 111c is formed on insulator 103, and upper insulator 104 is formed so as to cover third ground line 111c. Third ground line 111c is formed so as to overlap power supply line 112 in planar view. First ground line 111a and second ground line 111b are electrically connected to each other through a contact hole formed in gate insulator 102, and second ground line 111b and third ground line 111c are electrically connected to each other through a contact hole formed in insulator 103. In the portion in which the area of power supply line 112 is enlarged, second ground lines 111b are formed on both sides of power supply line 112 in the same layer as power supply line 112 such that power supply line 112 is sandwiched between second ground lines 111b. In the configuration of FIG. 13, power supply line 112 is surrounded by ground lines 111a, 111b, 111c, so that the radiation noise from power supply line 112 can be confined. The first bypass capacitor is formed by first ground line 111a and power supply line 112, and the second bypass capacitor is formed by third ground line 111c and power supply line 112, so that the power supply capacity can further be increased. Therefore, the influence of the radiation noise from power supply line 112 can further be reduced. The area of ground line 111 is increased by the areas of second ground line 111b and third ground line 111c, so that the heat dissipation effect can further be enhanced compared with the configuration in FIG. 10.

Figure 14:
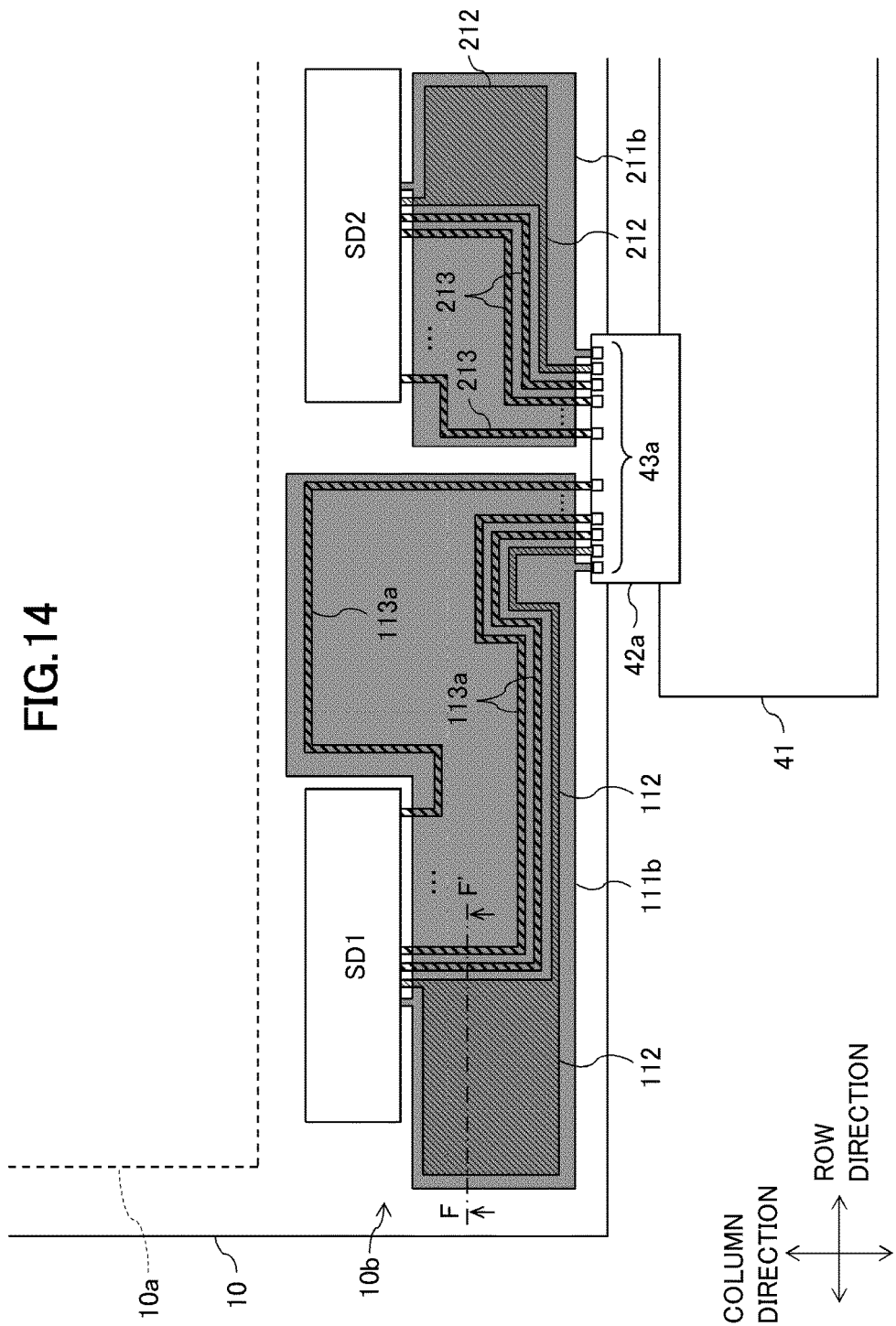
FIG. 14 is a plan view illustrating yet another arrangement configuration of ground line and power supply line.
Figure 15:
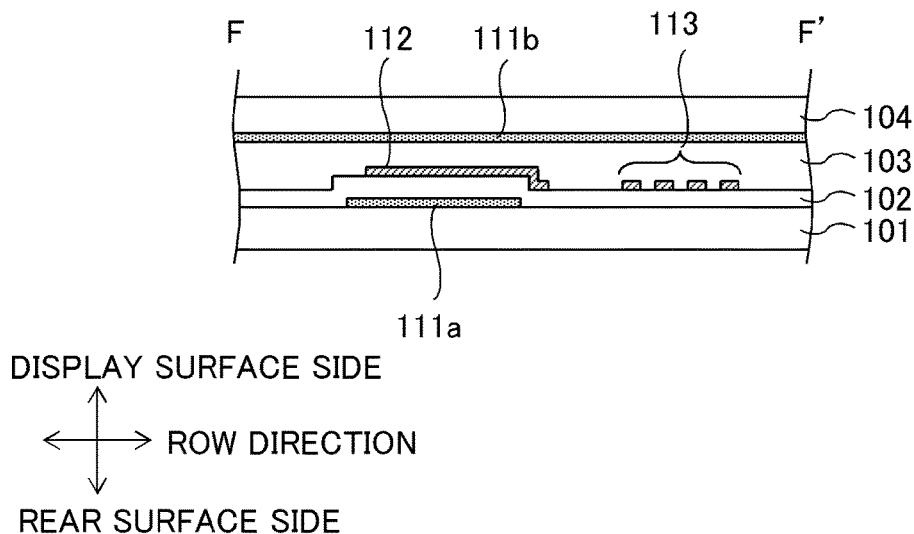
FIG. 15 is a sectional view taken along line F-F' in FIG. 14.

FIG. 14 is a plan view illustrating yet another arrangement configuration of ground line 111 and power supply line 112. FIG. 15 is a sectional view taken along line F-F' in FIG. 14. Referring to FIGS. 14 and 15, second ground line 111b is further formed in the upper layer of power supply line 112 and signal line 113 in the configuration of FIG. 10. Specifically, in TFT substrate 100, first ground line 111a is formed on glass substrate 101. Gate insulator 102 is formed so as to cover first ground line 111a. Power supply line 112 and signal line 113 are formed on gate insulator 102. Insulator 103 is formed so as to cover power supply line 112 and signal line 113. Second ground line 111b is formed on insulator 103, and upper insulator 104 is formed so as to cover second ground line 111b. First ground line 111a is omitted in FIG. 14. Second ground line 111b is widely and solidly formed so as to overlap power supply line 112 and signal line 113 in planar view. In the configuration of FIGS. 14 and 15, in addition to the radiation noise reduction effect because of the increase in power supply capacity and the heat dissipation effect because of the increase in areas of ground line 111 and power supply line 112, the influence of the noise from signal line 113 can be reduced because second ground line 111b covers signal line 113. As illustrated in FIG. 14, ground line 211b is formed so as to cover signal line 213 even in the region between input terminal 43a and source driver SD2.

Figure 16:
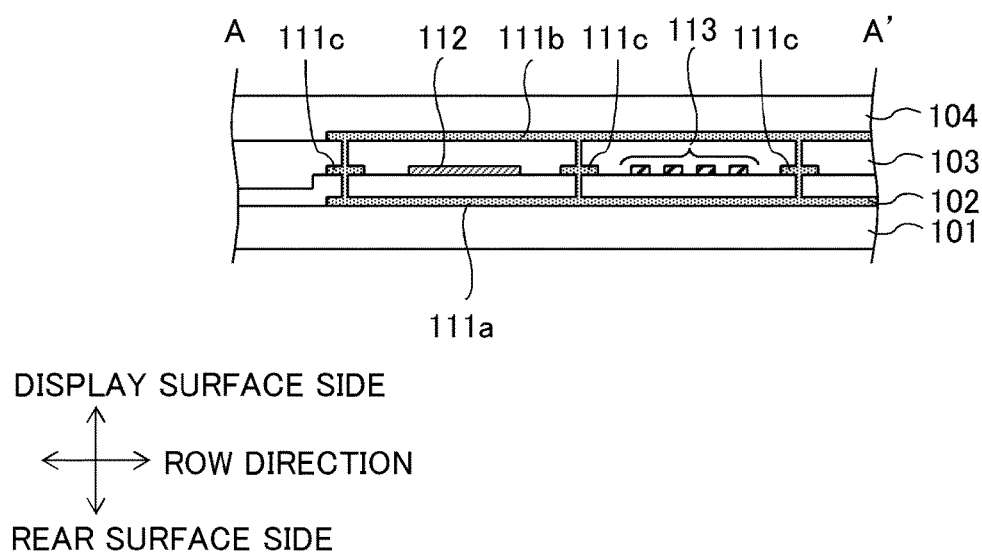
FIG. 16 is a sectional view illustrating yet another arrangement configuration of ground line and power supply line.

FIG. 16 is a sectional view illustrating yet another arrangement configuration of ground line 111 and power supply line 112. Referring to FIG. 16, third ground line 111c is further formed so as to surround power supply line 112 and signal line 113 in the configuration of FIG. 15. In the configuration of FIG. 16, power supply line 112 and signal line 113 are surrounded by ground lines 111a, 111b, 111c, so that the radiation noise from power supply line 112 and signal line 113 can be confined. The signal line surrounded by ground lines 111a, 111b, 111c needs not be all power supply lines 112 and all signal lines 113. For example, ground lines 111a, 111b, 111c may be formed so as to surround only power supply line 112, only signal line 113, or only some of the plurality of signal lines 113. Preferably, some of signal lines 113 are used to supply the data signal corresponding to the image data. Thus, preferably at least third ground lines 111c are formed at both the ends in the layer, which is located between first ground line 111a and second ground line 111b and is identical to the layer in which the plurality of signal lines (power supply line 112 and signal line 113) are formed, such that at least parts of the plurality of signal lines are sandwiched between third ground lines 111c, and third ground lines 111c are electrically connected to first ground line 111a and second ground line 111b.

Another arrangement configuration in the region in FIG. 6, where ground line 111, power supply line 112, and signal line 113 extend in the row direction, will be described below. The arrangement configuration in the region is not limited to the configuration in FIG. 8, but may be a configuration in FIG. 17 or a configuration in FIG. 18.

Figure 17:
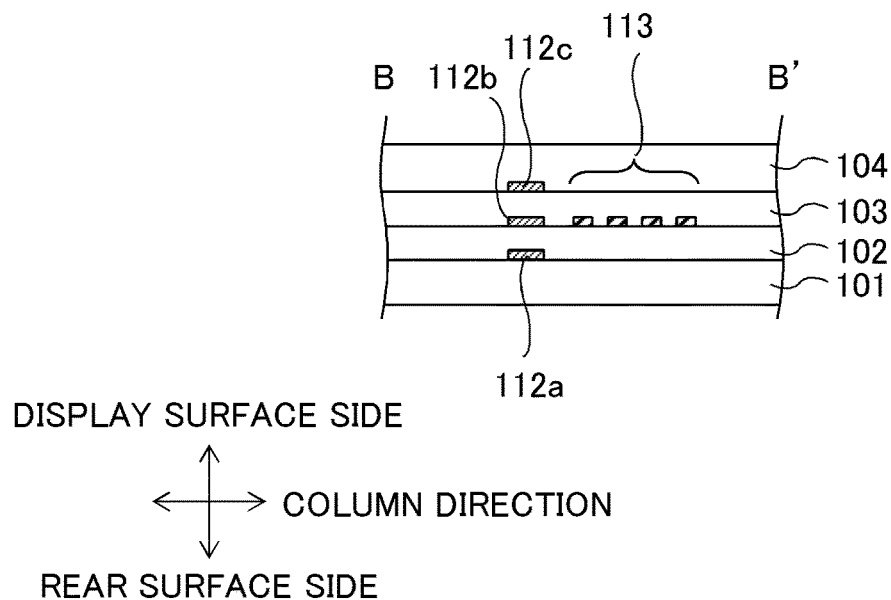
FIG. 17 is a sectional view illustrating yet another arrangement configuration of ground line and power supply line.

In the configuration of FIG. 17, power supply line 112 includes first power supply line 112a disposed in a lower layer, second power supply line 112b disposed in an intermediate layer, and third power supply line 112c disposed in an upper layer. In the configuration of FIG. 17, supply efficiency of power supply voltage can be enhanced because a wiring resistance of power supply line 112 can be lowered.

Figure 18:
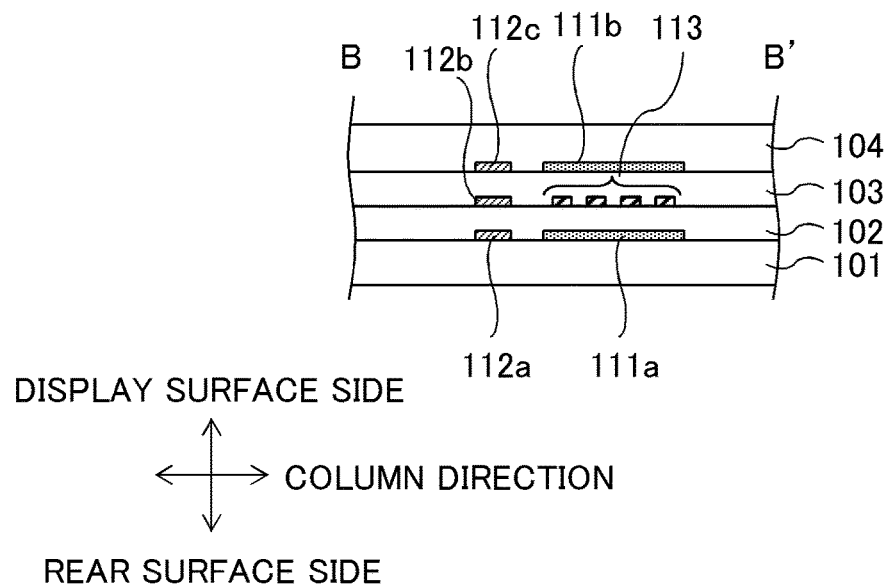
FIG. 18 is a sectional view illustrating yet another arrangement configuration of ground line and power supply line.

In the configuration of FIG. 18, in addition to the configuration in FIG. 17, ground line 111 includes first ground line 111a disposed in the lower layer and second ground line 111b disposed in the upper layer. Signal line 113 is disposed in a layer between first ground line 111a and second ground line 111b. In the configuration of FIG. 18, the influence of the noise from signal line 113 can further be reduced.

The arrangement configurations of ground line 111 and power supply line 112, which are connected to source driver SD1, are described above, and ground line 211 and power supply line 212, which are connected to source driver SD2, can have the same arrangement configuration (see FIG. 6). However, because susceptibility to the radiation noise increases with increasing distance from input terminal 43a, preferably the area of the overlapping portion between ground line 111 and power supply line 112, which are disposed near source driver SD1, is larger than the area of the overlapping portion between ground line 211 and power supply line 212, which are disposed near source driver SD2, as illustrated in FIGS. 6, 9, and 14. Preferably, the area of the overlapping portion is set in consideration of a balance between the radiation noise reduction effect obtained by the increase in power supply capacity because of the bypass capacitor formed by ground line 111 and power supply line 112 and the heat dissipation effect obtained by the increase in areas of ground line 111 and power supply line 112.

What is claimed is:
1. A display device comprising:
a display panel that displays an image;
a drive circuit that outputs a drive signal to the display panel;
a power supply line that is formed in the display panel to supply a power supply voltage to the drive circuit; and
a ground line that is formed in the display panel to supply a ground potential to the drive circuit,
wherein at least parts of the power supply line and the ground line overlap each other in planar view with an insulator interposed therebetween.
2. The display device according to claim 1, wherein
the ground line includes first and second ground lines through which the ground potential is supplied to the drive circuit, and the power supply line, the first ground line, and the second ground line are formed in different layers, respectively, and at least parts of the power supply line, the first ground line, and the second ground line overlap one another in planar view with an insulator interposed therebetween.

3. The display device according to claim 2, wherein the first ground line, the power supply line, and the second ground line are laminated in this order with the insulator interposed therebetween.

4. The display device according to claim 3, further comprising a plurality of signal lines through which a data signal and a control signal are supplied to the display panel to generate the drive signal,
wherein the ground line further includes third and fourth ground lines through which the ground potential is supplied to the drive circuit, and
the third ground line and the fourth ground line are formed at both ends in a layer, which is located between the first ground line and the second ground line and is identical to a layer in which the plurality of signal lines are formed, such that at least parts of the plurality of signal lines are sandwiched between the third ground line and the fourth ground line, and the third ground line and the fourth ground line are electrically connected to the first ground line and the second ground line.

5. The display device according to claim 1, wherein
the power supply line includes first and second supply lines through which the power supply voltage is supplied to the drive circuit, and
the ground line, the first power supply line, and the second power supply line are formed in different layers, respectively, and at least parts of the ground line, the first power supply line, and the second power supply line overlap one another in planar view with an insulator interposed therebetween.

6. The display device according to claim 5, wherein the first power supply line, the ground line, and the second power supply line are laminated in this order with the insulator interposed therebetween.

7. The display device according to claim 1, further comprising a signal line through which a data signal and a control signal are supplied to the display panel to generate the drive signal,
wherein a part of the ground line overlaps the signal line in planar view with an insulator interposed therebetween.

8. The display device according to claim 1, wherein
a plurality of the drive circuits are mounted on the display panel,
the display device further comprising a control circuit substrate connected to the display panel and on which a control circuit is mounted, the control circuit outputting a data signal and a control signal, the power supply voltage, and the ground potential, the data signal and a control signal being used to generate the drive signal,
each of the plurality of the drive circuits includes a first drive circuit closer to an input terminal to which each of the signals output from the control circuit substrate is input in the display panel and a second drive circuit farther from the input terminal than the first drive circuit, and
an area of an overlapping portion in which the power supply line and the ground line connected to the second drive circuit overlap each other is larger than an area of an overlapping portion in which the power supply line and the ground line connected to the first drive circuit overlap each other.

9. The display device according to claim 1, wherein
the display panel includes a plurality of gate lines, a plurality of data lines, a common electrode, a common wiring through which a common voltage is supplied to the common electrode, and a plurality of pixel electrodes, and
one of the power supply line and the ground line is formed in a layer identical to a layer in which the plurality of gate lines are formed, and another of the power supply line and the ground line is formed in a layer identical to a layer in which the plurality of data lines are formed, or
one of the power supply line and the ground line is formed in a layer identical to a layer in which the plurality of data lines are formed, and another of the power supply line and the ground line is formed in a layer identical to a layer in which the common electrode is formed.

* * * * *